(12) United States Patent
Choi et al.

(10) Patent No.: US 8,872,758 B2
(45) Date of Patent: Oct. 28, 2014

(54) ELECTRO-WETTING DISPLAY SUBSTRATE AND METHOD OF MANUFACTURING THE SAME

(71) Applicant: Liquavista B.V., Eindhoven (NL)

(72) Inventors: Sang-Gun Choi, Suwon-si (KR); Tae-Gyun Kim, Seoul (KR); Woo-Yong Sung, Seoul (KR); A-Ram Lee, Hwaseong-si (KR); Tae-Woon Cha, Seoul (KR); Seung-Yeon Chae, Hwaseong-si (KR); Hyoung-Sub Lee, Seoul (KR)

(73) Assignee: Liquavista B.V., Eindhoven (NL)

( * ) Notice: Subject to any disclaimer, the term of this patent is extended or adjusted under 35 U.S.C. 154(b) by 149 days.

(21) Appl. No.: 13/685,087

(22) Filed: Nov. 26, 2012

(65) Prior Publication Data

US 2013/0141317 A1    Jun. 6, 2013

(30) Foreign Application Priority Data

Dec. 5, 2011    (KR) .................. 10-2011-0129170

(51) Int. Cl.
```
G09G 3/34      (2006.01)
G02B 26/00     (2006.01)
G09G 3/20      (2006.01)
H01L 33/00     (2010.01)
```
(52) U.S. Cl.
CPC ................ *G09G 3/20* (2013.01); *G02B 26/005* (2013.01); *G09G 3/348* (2013.01); *G09G 2300/0404* (2013.01); *H01L 33/005* (2013.01)
USPC .......................................... 345/107; 359/296

(58) Field of Classification Search
CPC ..... G09G 3/433; G09G 3/344; G09G 3/3446; G09G 3/3453; G09G 3/348; G02B 26/004; G02B 26/005; G02B 2207/115; G02F 1/167; G02F 2201/12
USPC ........................... 345/105–107; 359/290, 296
See application file for complete search history.

(56) References Cited

U.S. PATENT DOCUMENTS

| | | | |
|---|---|---|---|
| 2009/0058840 A1 | 3/2009 | Lee et al. | |
| 2011/0084944 A1* | 4/2011 | Bae | |
| 2013/0222355 A1* | 8/2013 | Choi et al. | 345/107 |
| 2013/0271816 A1* | 10/2013 | Shim et al. | 359/290 |

FOREIGN PATENT DOCUMENTS

KR    1020110045538 A    5/2011

* cited by examiner

*Primary Examiner* — Regina Liang
(74) *Attorney, Agent, or Firm* — Lee & Hayes, PLLC

(57) ABSTRACT

An electro-wetting display substrate includes a base substrate including a gate line extending in a first direction and a data line extending in a second direction, where the first direction is different from the second direction, a switching element electrically connected to the gate line and the data line, a pixel electrode electrically connected to the switching element, a notch electrode disposed adjacent to the switching element and overlapping the pixel electrode, and a water-repellent layer disposed over the pixel electrode.

24 Claims, 15 Drawing Sheets

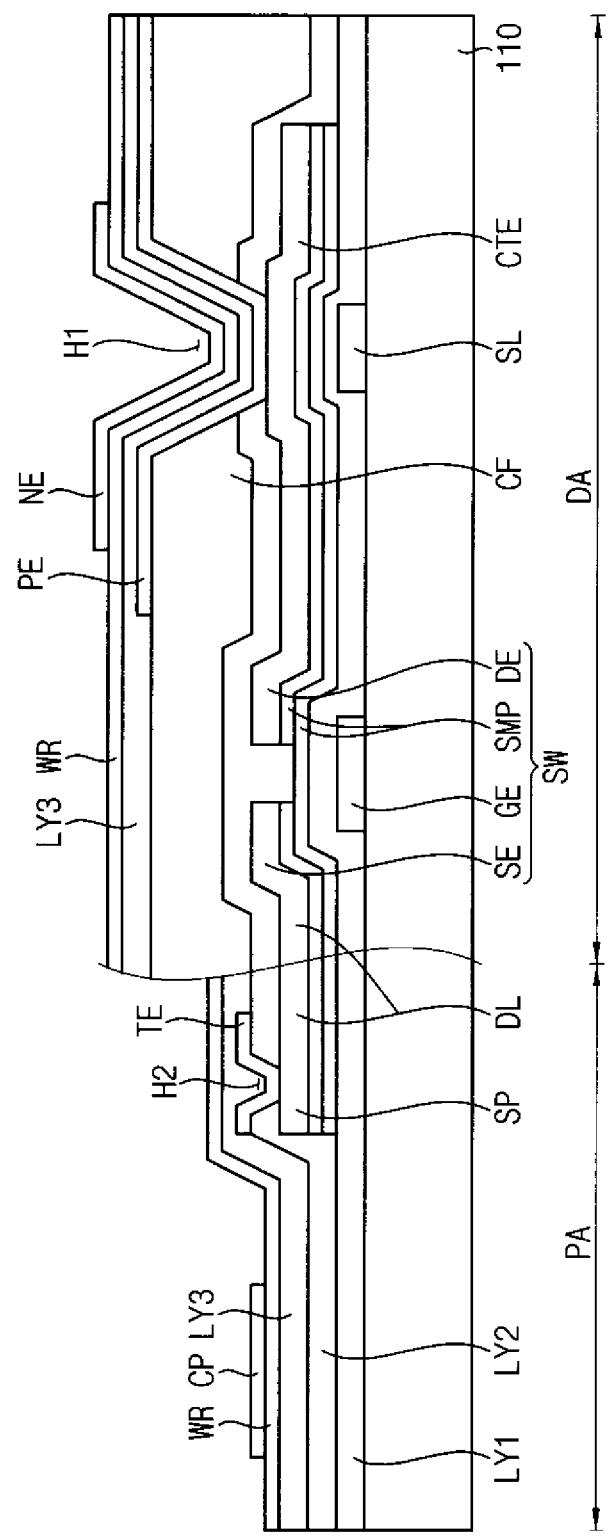

ELECTRO-WETTING DISPLAY SUBSTRATE AND METHOD OF MANUFACTURING THE SAME

This application claims priority to Korean Patent Application No. 10-2011-0129170, filed on Dec. 5, 2011, and all the benefits accruing therefrom under 35 U.S.C. §119, the content of which in its entirety is herein incorporated by reference.

BACKGROUND OF THE INVENTION

1. Field of the Invention

Exemplary embodiments of the invention relate to an electro-wetting display substrate and a method of manufacturing the electro-wetting display substrate. More particularly, exemplary embodiments of the invention relate to an electro-wetting display substrate of an electro-wetting display panel and a method of manufacturing the electro-wetting display substrate.

2. Description of the Related Art

Recently, an electro-wetting display apparatus ("EWD") has been developed. The EWD includes aqueous liquid and non-aqueous liquid disposed in a pixel. In the EWD, a voltage is applied to the aqueous liquid (for example, water) to change a surface tension of the water, and then the non-aqueous liquid (for example, oil) is moved to transmit light through the pixel.

The EWD controls movement of oil based on a voltage difference between electrodes to control light transmittance. The oil moves toward to an electrode provided with substantially the same voltage as one of the electrodes and disposed adjacent to a side of another of the electrodes having a different voltage.

When the voltage difference between the electrodes is zero (0), the oil does not move. Thus, the light provided from outside does not pass through the pixel covered by the oil such that the EWD displays black image.

When the voltage difference between the electrodes is not zero (0), the oil moves due to a surface tension of the water such that the pixel is not covered by the oil. When the pixel is not covered by the oil, the light provided from outside transmits the pixel such that the EWD displays another state except the black state.

However, the EWD typically includes further elements such as an additional electrode, such that an aperture ratio of the pixel thereof may decrease.

BRIEF SUMMARY OF THE INVENTION

Exemplary embodiments of the present invention provide an electro-wetting display substrate capable of increasing an aperture ratio.

Exemplary embodiments of the present invention also provide a method of manufacturing the electro-wetting display substrate.

According to an exemplary embodiment of the invention, an electro-wetting display substrate includes a base substrate including a gate line extending in a first direction and a data line extending in a second direction, where the first direction is different from the second direction, a switching element electrically connected to the gate line and the data line, a pixel electrode electrically connected to the switching element, a notch electrode disposed adjacent to the switching element and overlapping the pixel electrode, and a water-repellent layer disposed over the pixel electrode.

In an exemplary embodiment, the notch electrode may overlap a contact electrode extending from a drain electrode of the switching element.

In an exemplary embodiment, the electro-wetting display substrate may further include a storage line spaced apart from a gate electrode of the switching element and overlapping the pixel electrode, where the contact electrode may extend along the storage line.

In an exemplary embodiment, the electro-wetting display substrate may further include a first insulating layer disposed between the storage line and the contact electrode, a second insulating layer disposed between the contact electrode and the pixel electrode and a third insulating layer disposed between the pixel electrode and the notch electrode. In such an embodiment, the storage line, the contact electrode and the first insulating layer may collectively define a first capacitor, and the pixel electrode, the notch electrode and the third insulating layer may collectively define a second capacitor.

In an exemplary embodiment, the second insulating layer may include a color filter pattern.

In an exemplary embodiment, the water-repellent layer may be disposed between the third insulating layer and the notch electrode.

In an exemplary embodiment, the electro-wetting display substrate may further include a common pad extending from the notch electrode, where a common voltage is applied to the common pad, a data pad extending from the data line, and a transparent electrode electrically connected to the data pad, where a data signal is applied to the transparent electrode. In such an embodiment, a hole may be formed through a portion of the third insulating layer and the water-repellent layer such that the transparent electrode may be connected to an external device through the hole.

In an exemplary embodiment, the water-repellent layer may be disposed on the notch electrode.

In an exemplary embodiment, the electro-wetting display substrate may further include a common pad extending from the notch electrode. In such an embodiment, a common voltage may be applied to the common pad, and a hole may be formed through a portion of the water-repellent layer such that the common pad may be connected to a short point through the hole.

In an exemplary embodiment, the electro-wetting display substrate may further include a filling member disposed in a contact hole, which is formed through the second and third insulating layers and partially exposes the contact electrode, where the filling member includes a conductive material.

In an exemplary embodiment, the pixel electrode may be disposed between the contact hole and the filling member.

In an exemplary embodiment, the electro-wetting display substrate may further include a storage line spaced apart from the gate electrode, and overlapping the pixel electrode. In such an embodiment, the storage line may be spaced apart from a contact electrode extending from a drain electrode of the switching element, and the notch electrode may overlap the storage line.

According to another exemplary embodiment of the invention, a method of manufacturing an electro-wetting display substrate includes: providing a gate pattern on a base substrate, where the gate pattern includes a gate line and a gate electrode extending from the gate line; providing a data pattern on the base substrate, on which the gate pattern is disposed, where the data pattern includes a data line extending in a direction different from the gate line, a source electrode extending from the data line, and a drain electrode spaced apart from the source electrode; providing a pixel electrode on the base substrate, on which the data pattern is provided, where the pixel electrode is electrically connected to the drain electrode; providing a notch electrode on the base substrate, on which the pixel electrode is disposed, where the notch electrode is adjacent to the switching element, and the notch electrode overlaps the pixel electrode; and providing a water-repellent over the pixel electrode.

In an exemplary embodiment, the providing the data pattern on the base substrate, on which the gate pattern is disposed, may include providing a contact electrode extending from the drain electrode, where the notch electrode may overlap the contact electrode.

In an exemplary embodiment, the providing the gate pattern on a base substrate may include providing a storage line spaced apart from the gate electrode, where the storage line overlaps the pixel electrode, where the contact electrode may extend along the storage line.

In an exemplary embodiment, the method may further include: providing a color filter pattern on the base substrate, on which the data pattern is provided; and removing a portion of the color filter pattern such that a contact hole is formed therein, where the contact hole may expose the contact electrode, and the pixel electrode may be connected to the contact electrode through the contact hole.

In an exemplary embodiment, the method may further include: providing a filling member by filling a conductive filling material in the contact hole.

In an exemplary embodiment, the method may further include: providing a filling member by filling a conductive filling material in the contact hole, in which the pixel electrode is disposed.

In an exemplary embodiment, the method may further include: providing an insulating layer on the base substrate, on which the pixel electrode may be provided, where the water-repellent layer is provided on the insulating layer, and the notch electrode may be provided on the water-repellent layer.

In an exemplary embodiment, the method may further include: removing a portion of the insulating layer and the water-repellent layer using a shadow mask, where the providing the pixel electrode on the base substrate, on which the data pattern is provided, may include providing a transparent electrode connected to a data pad extending from the data line, where a data signal is applied to the transparent electrode, and where the transparent electrode may be exposed through the removed portion of the insulating layer and the water-repellent layer.

In an exemplary embodiment, the method may further include: providing an insulating layer on the base substrate, on which the pixel electrode may be provided, where the water-repellent layer may be provided on the notch electrode.

In an exemplary embodiment, the method may further include: removing a portion of the water-repellent layer using a shadow mask, where the providing the notch electrode on the base substrate, on which the pixel electrode is disposed, may include providing a common pad extending from the notch electrode, where a common voltage provided from outside may be applied to the common pad, and where the common pad may be exposed by the removed portion of water-repellent layer.

In an exemplary embodiment, the method may further include: removing a portion of the insulating layer using a shadow mask, where the providing the pixel electrode on the base substrate, on which the data pattern is provided, may include providing a transparent electrode connected to a data pad extending from the data line, where a data signal from outside may be applied to the transparent electrode, and where the transparent electrode may be exposed through the removed portion of the insulating layer.

In an exemplary embodiment, the providing the gate pattern on a base substrate may include providing a storage line spaced apart from the gate electrode and overlapping the pixel electrode, the providing the data pattern on the base substrate, on which the gate pattern is disposed, may include providing a contact electrode extending from the drain electrode and spaced apart from the storage line, and the notch electrode may overlap the storage line.

According to an exemplary embodiment of an electro-wetting display substrate and a method of manufacturing the electro-wetting display substrate, a notch electrode is disposed over a pixel electrode, and overlaps a drain electrode of a switching element, such that an aperture ratio of a pixel part is substantially increased.

In an exemplary embodiment, the notch electrode is disposed over the pixel electrode, and overlaps a storage line, such that an aperture ratio of a pixel part is substantially increased.

In an exemplary embodiment, the notch electrode and the pixel electrode are overlapping each other such that a second storage capacitor is collectively defined by the notch electrode and the pixel electrode. In such an embodiment, a size of the storage line of a first storage capacitor decreases, such that an aperture ratio of a pixel part is substantially increased.

In an exemplary embodiment, a filling member is disposed in a first contact hole, such that unevenness due to the first contact hole is effectively prevented, and break-up of a first fluid due to the first contact hole is thereby effectively prevented.

In an exemplary embodiment, a water-repellent layer is disposed on the notch electrode, such that a direct contact between the notch electrode and a second fluid may be prevented, and the reliability of the notch electrode is thereby substantially improved.

BRIEF DESCRIPTION OF THE DRAWINGS

The above and other features of the invention will become more apparent by describing in detailed exemplary embodiments thereof with reference to the accompanying drawings, in which:

FIGS. 3A and 3B are cross-sectional views illustrating an exemplary embodiment of a method of manufacturing the first electro-wetting display substrate of FIG. 1;

DETAILED DESCRIPTION OF THE INVENTION

Figure 1:
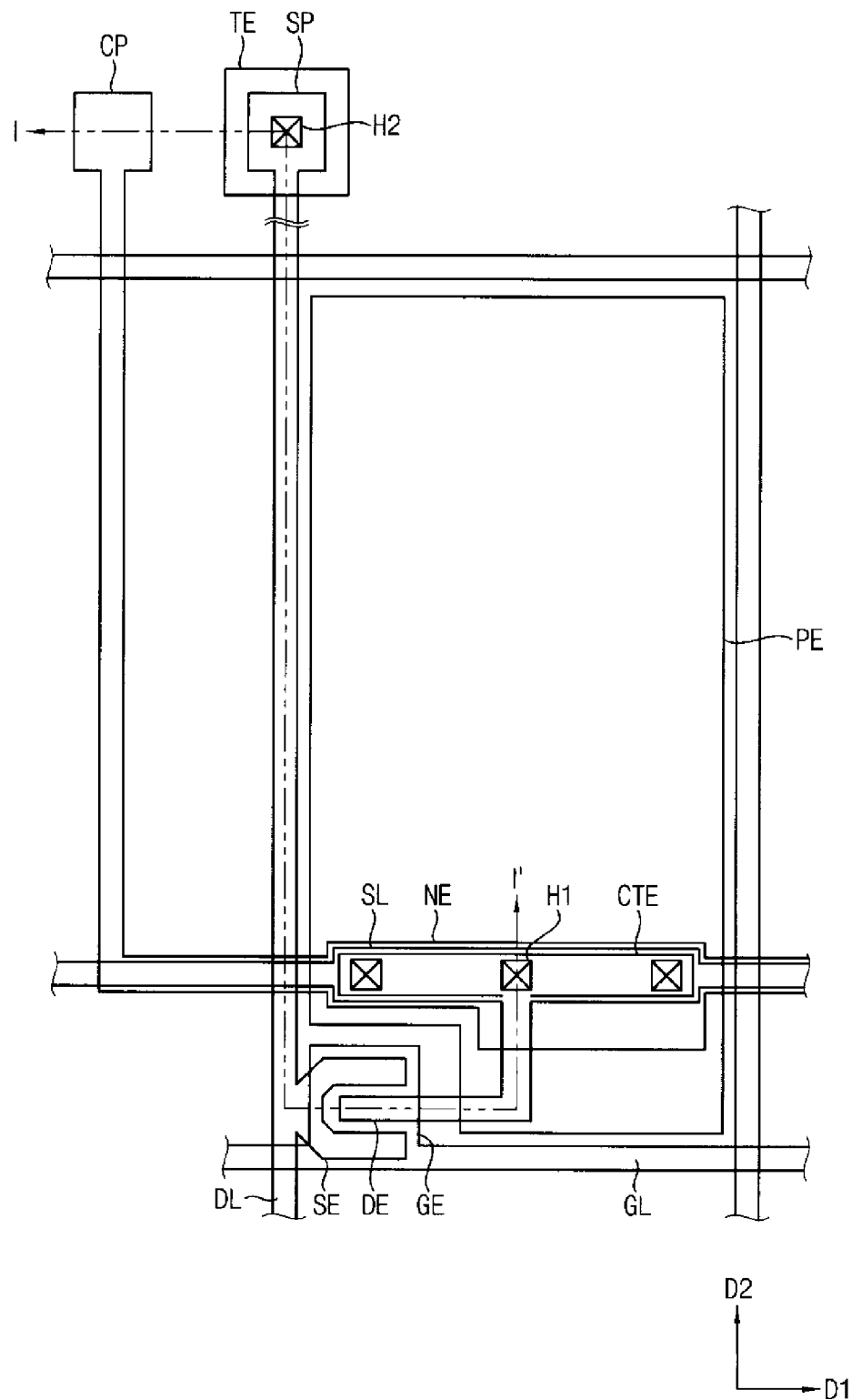
FIG. 1 is a plan view of an exemplary embodiment of a first electro-wetting display substrate according to the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims set forth herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, exemplary embodiments of the invention will be described in detail with reference to the accompanying drawings.

Figure 2:
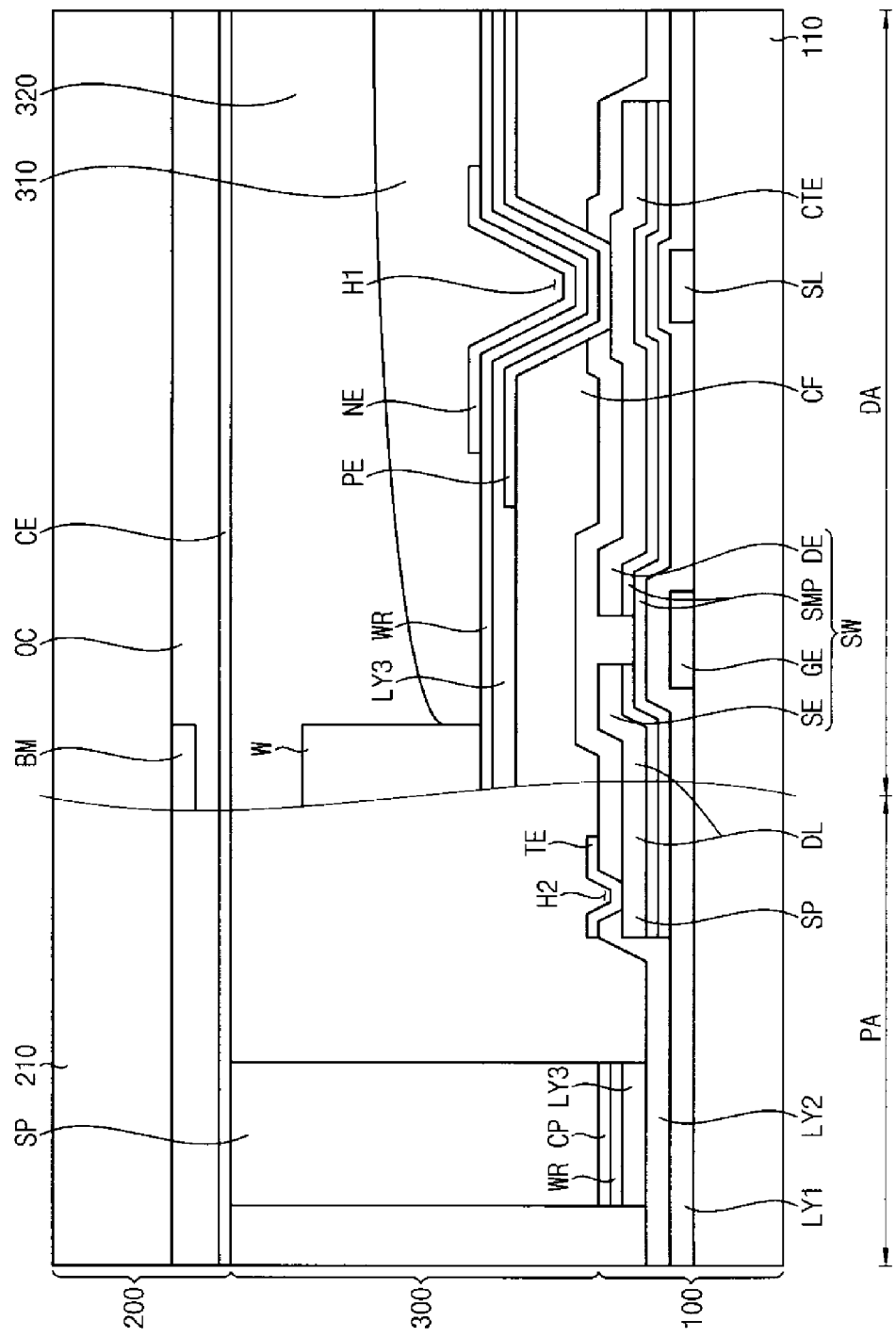
FIG. 2 is a cross-sectional view taken along line I-I' of FIG. 1, illustrating an electro-wetting display panel including the first electro-wetting display substrate of FIG. 1.

FIG. 1 is a plan view of an exemplary embodiment of a first electro-wetting display substrate according to an exemplary embodiment of the present invention. FIG. 2 is a cross-sectional view taken along line I-I' of FIG. 1, illustrating an electro-wetting display panel including the first electro-wetting display substrate of FIG. 1.

Referring to FIGS. 1 and 2, an electro-wetting display panel includes a first electro-wetting display substrate 100, a second electro-wetting display substrate 200, disposed opposite to, e.g., facing, the first electro-wetting display substrate 100 and a fluidic layer 300 disposed between the first electro-wetting display substrate 100 and the second electro-wetting display substrate 200.

The first electro-wetting display substrate 100 includes a first base substrate 110, a pixel part and a pad part.

The pixel part may be in a display area DA of the first base substrate 110, and the pad part may be in a peripheral area PA surrounding at least a portion of the display area DA.

The pixel part includes a gate line GL, a storage line SL, a first insulating layer LY1, a data line DL, a switching element SW, a contact electrode CTE, a second insulating layer LY2, a color filter pattern CF, a pixel electrode PE, a third insulating layer LY3, a water-repellent layer WR, a notch electrode NE and a partition wall W.

The gate line GL is disposed on the first base substrate 110 and extends in a first direction D1. The storage line SL is spaced apart from the gate line GL. The storage line SL may extend in the first direction D1.

The data line DL extends in a second direction D2, which is different from the first direction D1.

The first insulating layer LY1 is disposed on the gate line GL, and covers the gate line GL. The data line DL is disposed on the first insulating layer LY1. In one exemplary embodiment, for example, the first insulating layer LY1 is disposed between the gate line GL and the data line DL.

The switching element SW includes a gate electrode GE, a source electrode SE, a drain electrode DE and a semiconductor pattern SMP.

The gate electrode GE extends from the gate line GL. The source electrode SE extends from the data line DL, and is disposed over the gate electrode GE. The drain electrode DE is spaced apart from the source electrode SE and disposed over the gate electrode GE.

The contact electrode CTE is disposed over the first insulating layer LY1 and extends from the data electrode DE to the storage line SL. The contact electrode CTE extends along the storage line SL, and overlaps the storage line SL. The contact electrode CTE and the storage line SL collectively define a first storage capacitor with the first insulating layer LY1 as a dielectric.

The semiconductor pattern SMP is disposed between the gate electrode GE and the source and drain electrodes SE and DE. The semiconductor pattern SMP may include an active pattern and an ohmic contact pattern. The active pattern may include amorphous silicon ("a-Si"), and the ohmic contact pattern may include n+ amorphous silicon ("n+ a-Si").

The second insulating layer LY2 is disposed on the switching element SW, and covers the switching element SW. The second insulting layer LY2 may be disposed between the switching element SW and the pixel electrode PE.

The color filter pattern CF is disposed on the second insulating layer LY2. In an exemplary embodiment, the color filter pattern CF may be one of red, green and blue color filter patterns, for example, but not being limited thereto.

A first contact hole H1 is formed through the second insulating layer LY2 and the color filter pattern CF such that a portion of the contact electrode CTE is exposed through the first contact hole H1.

The pixel electrode PE is disposed on the color filter pattern CF and electrically connected to the contact electrode CTE extending from the drain electrode DE via the first contact hole H1. The pixel electrode PE may include transparent conductive oxide ("TCO"). In one exemplary embodiment, for example, the pixel electrode PE may include indium-tin-oxide ("ITO") or indium-zinc-oxide ("IZO")".

The third insulating layer LY3 is disposed on the pixel electrode PE, and covers the pixel electrode PE. The third insulating layer LY3 may include silicon nitride (SiNx) or silicon oxide (SiOx), for example.

The water-repellent layer WR is disposed on the third insulating layer LY3. The third insulating layer LY3 and the water-repellent layer WR is disposed between the pixel electrode PE and the notch electrode NE.

The notch electrode NE is disposed on the water-repellent layer WR and overlaps an end portion of the pixel electrode PE, which is adjacent to the switching element SW. In one exemplary embodiment, for example, the notch electrode NE may overlap the contact electrode CTE.

In an exemplary embodiment, the notch electrode NE is disposed on a portion of the pixel electrode PE that overlaps the contact electrode CTE such that the aperture ratio of the pixel part substantially increases.

The notch electrode NE and the pixel electrode PE collectively define a second storage capacitor with the third insulating layer LY3 as a dielectric.

The notch electrode NE may include metal or TCO.

In an exemplary embodiment, the first electro-wetting display substrate 100 further includes the second storage capacitor, such that a size of the storage line SL substantially decreases, and the aperture ratio of the pixel part thereby substantially increase.

The pad part includes a signal pad SP extending from the data line DL, a transparent electrode TE electrically connected to the signal pad SP via a second contact hole H2, and a common pad CP extending from the notch electrode NE.

The signal pad SP may receive data a signal from outside via the transparent electrode TE. The common pad CP is electrically connected to a common electrode CE of the second electro-wetting display substrate 200 via a short point disposed between the common pad CP and the common electrode CE, such that the common pad CP may receive the common voltage and provide the common voltage to the notch electrode NE.

The first base substrate 110 may further include a storage electrode (not shown) including a material substantially the same as a material of the gate line GL and spaced apart from the gate line GL. In one exemplary embodiment, for example, the storage line may extend along the data line DL.

The second electro-wetting display substrate 200 includes a second base substrate 210, a light blocking pattern BM, an over-coating layer OC and the common electrode CE. The common electrode CE is disposed opposite to, e.g., facing, the pixel electrode PE.

The fluidic layer 300 includes a first fluid 310 and a second fluid 320. The first fluid 310 is hydrophobic, and the second fluid 320 is hydrophilic.

The first fluid 310 is disposed in a receiving space defined by the partition wall W. In one exemplary embodiment, for example, the first fluid 310 may include black oil. In an exemplary embodiment, the first fluid 310 and the second fluid 320 are disposed in a space between the first electro-wetting display substrate 100 and the second electro-wetting display substrate 200. In an exemplary embodiment, the first fluid 310 is disposed in a lower portion of the space between the first electro-wetting display substrate 100 and the second electro-wetting display substrate 200, and the second fluid 320 is dispose an upper portion of the space between the first electro-wetting display substrate 100 and the second electro-wetting display substrate 200.

When a voltage applied to the common electrode CE is substantially the same as a voltage applied to the pixel electrode PE, a voltage difference is not generated between the common electrode CE and the pixel electrode PE. The first fluid 310 is overlapping substantially an entire portion in the receiving space without the voltage difference between the common electrode CE and the pixel electrode PE, such that the first fluid 310 covers the pixel electrode PE. When the first fluid 310 covers the pixel electrode PE, the light passing through a portion of the first electro-wetting display substrate 100 or the second electro-wetting display substrates 200, which is corresponding to the pixel electrode PE, is blocked by the first fluid 310, such that the pixel part may display a black image corresponding to a black grayscale.

When a voltage applied to the common electrode CE is different from the pixel electrode PE, a voltage difference is generated between the common electrode CE and the pixel electrode PE. The first fluid 310 moves toward the notch electrode NE that receives the same voltage as the common electrode CE while difference from the pixel electrode PE such that a transmitting area TA, in which light is transmitted, is formed.

When the first fluid 310 moves toward the notch electrode NE, the light is passing through the corresponding portion of the first electro-wetting display substrate 100 or the second electro-wetting display substrate 200 such that the pixel part displays an image corresponding to a grayscale other than the black grayscale.

In an exemplary embodiment, the first electro-wetting display substrate 100 includes the color filter pattern CF. In an alternative exemplary embodiment, the first electro-wetting display substrate 100 may include a transparent organic layer, and the first fluid 310 may have a color, e.g., may be red, green and blue oils, for example.

In another alternative exemplary embodiment, the first electro-wetting display substrate 100 may include the transparent organic layer, and the second electro-wetting display substrate 200 may include the color filter pattern CF.

Figure 3A:
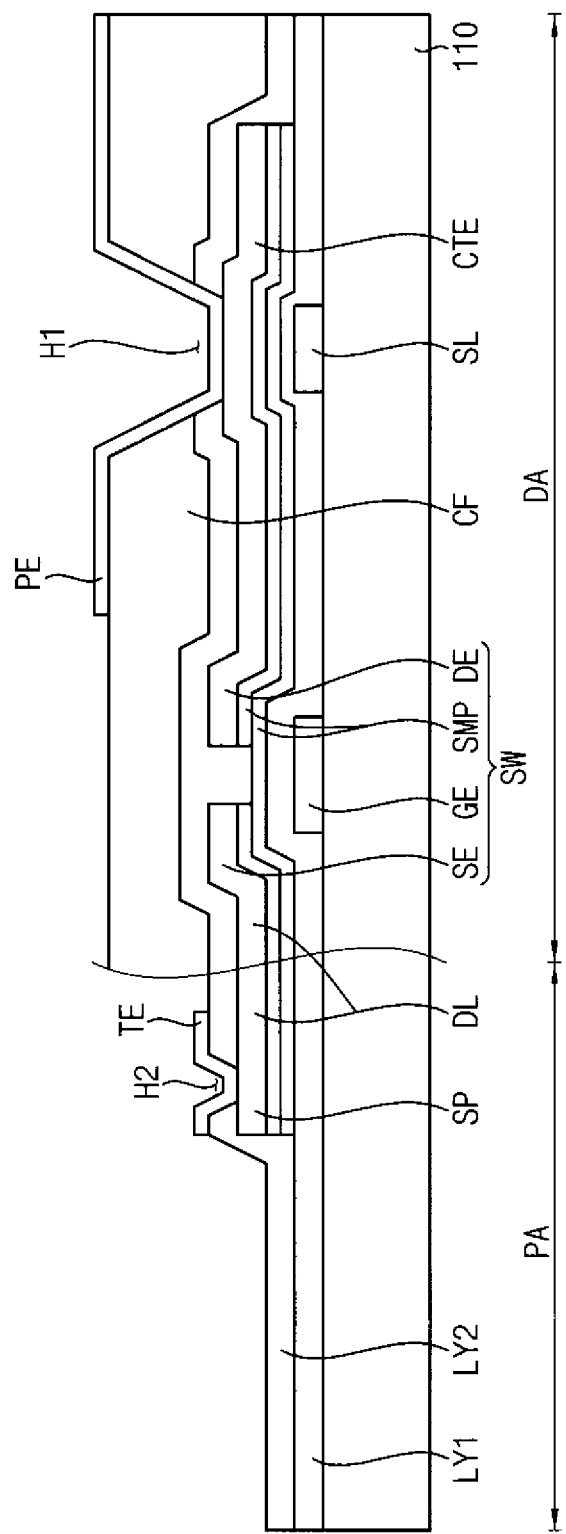

FIGS. 3A and 3B are cross-sectional views illustrating an exemplary embodiment of a method of manufacturing the first electro-wetting display substrate of FIG. 1.

Referring to FIG. 3A, a gate pattern including the gate line GL, the storage line SL and the gate electrode GE is provided, e.g., formed, on the first base substrate 110. The gate pattern may include a metal, e.g., copper Cu. In an exemplary embodiment, the gate pattern may have a single layered structure. In an alternative exemplary embodiment, the gate pattern may have a multi-layered structure.

In such an embodiment, the first insulating layer LY1 is formed on the first base substrate 110 including the gate pattern, and covers the gate pattern.

In such an embodiment, the semiconductor pattern SMP and a data pattern including the data line DL, the source electrode SE, the drain electrode DE, the contact electrode CTE and the signal pad SP are provided on the first insulating layer LY1. The data pattern may include a metal, e.g., copper Cu. In an exemplary embodiment, the data pattern may have a single layered structure. In an alternative exemplary embodiment, the data pattern may have a multi-layered structure.

In one exemplary embodiment, for example, a semiconductor layer and a data metal layer are sequentially provided on the first insulating layer LY1. In an exemplary embodiment, the semiconductor pattern SMP and the data pattern are provided by patterning the semiconductor layer and the data metal layer using a photo process at the same time.

In an alternative exemplary, the semiconductor pattern SMP and the data pattern are provided using separate process. In one exemplary embodiment, for example, the semiconductor layer is provided, and then patterned to provide the semiconductor pattern SMP. Then, the data metal layer is provided on the first base substrate 110 including the semiconductor pattern SMP, and then patterned to provide the data pattern.

In such an embodiment, the second insulating layer LY2 and a color filter layer are sequentially provided on the first base substrate 110 including the data pattern. The color filter layer is patterned, such that the color filter pattern CF is provided in the display area DA of the first base substrate 110. In one exemplary embodiment, for example, the color filter pattern includes red, green and blue color filter patterns.

In an exemplary embodiment, the second insulating layer LY2 in the peripheral area PA of the first base substrate 110 is exposed by patterning the color filter layer.

In the display area DA of the first base substrate 110, the first contact hole H1 is formed by removing a portion of the second insulating layer LY2 and the color filter pattern CF. In such an embodiment, the first contact hole H1 partially exposes the contact electrode CTE.

In the peripheral area PA of the first base substrate 110, the second contact hole H2 is formed by removing a portion of the second insulating layer LY2. In such an embodiment, the second contact hole H2 partially exposes the signal pad SP.

In an alternative exemplary embodiment, additional insulating layer is further provided on the second insulating layer LY2 of the peripheral area PA of the first base substrate 110, and the second insulating layer LY2 and the additional insulating layer is partially removed in the peripheral area PA of the first base substrate 110, such that the second contact hole H2 is formed.

Then, the pixel electrode PE is provided on the color filter pattern CF, in which the first contact hole H1 is formed, and the transparent electrode TE is provided on the second insulating layer LY2, in which the second contact hole H2 is formed.

The pixel electrode PE is electrically connected to the contact electrode CTE via the first contact hole H1, and the transparent electrode TE is electrically connected to the signal pad SP via the second contact hole H2.

Referring to FIG. 3B, the third insulating layer LY3 and the water-repellent layer WR are sequentially provided on the first base substrate 110 including the pixel electrode and the transparent electrode TE.

The notch electrode NE is provided on a portion of the water-repellent layer WR, which is overlapping the contact electrode CTE, and the common pad CP extending from the notch electrode NE is provided. In one exemplary embodiment, for example, the notch electrode NE may be provided using a sputter process, a roll printing process or an ink jet process, for example.

Referring again to FIG. 2, in an exemplary embodiment, the third insulating layer LY3 and the water-repellent layer WR are partially removed using a shadow mask, such that the transparent electrode TE is exposed. In such an embodiment, the transparent electrode TE may be electrically connected to, for example, a data driver, and may receive a data signal.

In such an embodiment, an organic layer is provided on the first base substrate 110 including the notch electrode NE and the common pad CP disposed thereon, and which exposes the transparent electrode TE. In an exemplary embodiment, the partition wall W overlapping the gate line GL and the data line DL may be provided by patterning the organic layer.

In an exemplary embodiment, as described above, the first electro-wetting display substrate 100 including the notch electrode NE disposed on the water-repellent layer WR and overlapping the contact electrode CTE may be provided.

According to an exemplary embodiment, the first electro-wetting display substrate 100 includes the notch electrode NE disposed on the pixel electrode PE and overlapping the contact electrode CTE, such that the aperture ratio of the pixel part is substantially increased.

In an exemplary embodiment, the first electro-wetting display substrate 100 includes the second storage capacitor collectively defined by the notch electrode NE, the pixel electrode PE and the third insulating layer LY3, such that the aperture ratio of the pixel part is substantially increased.

Figure 4:
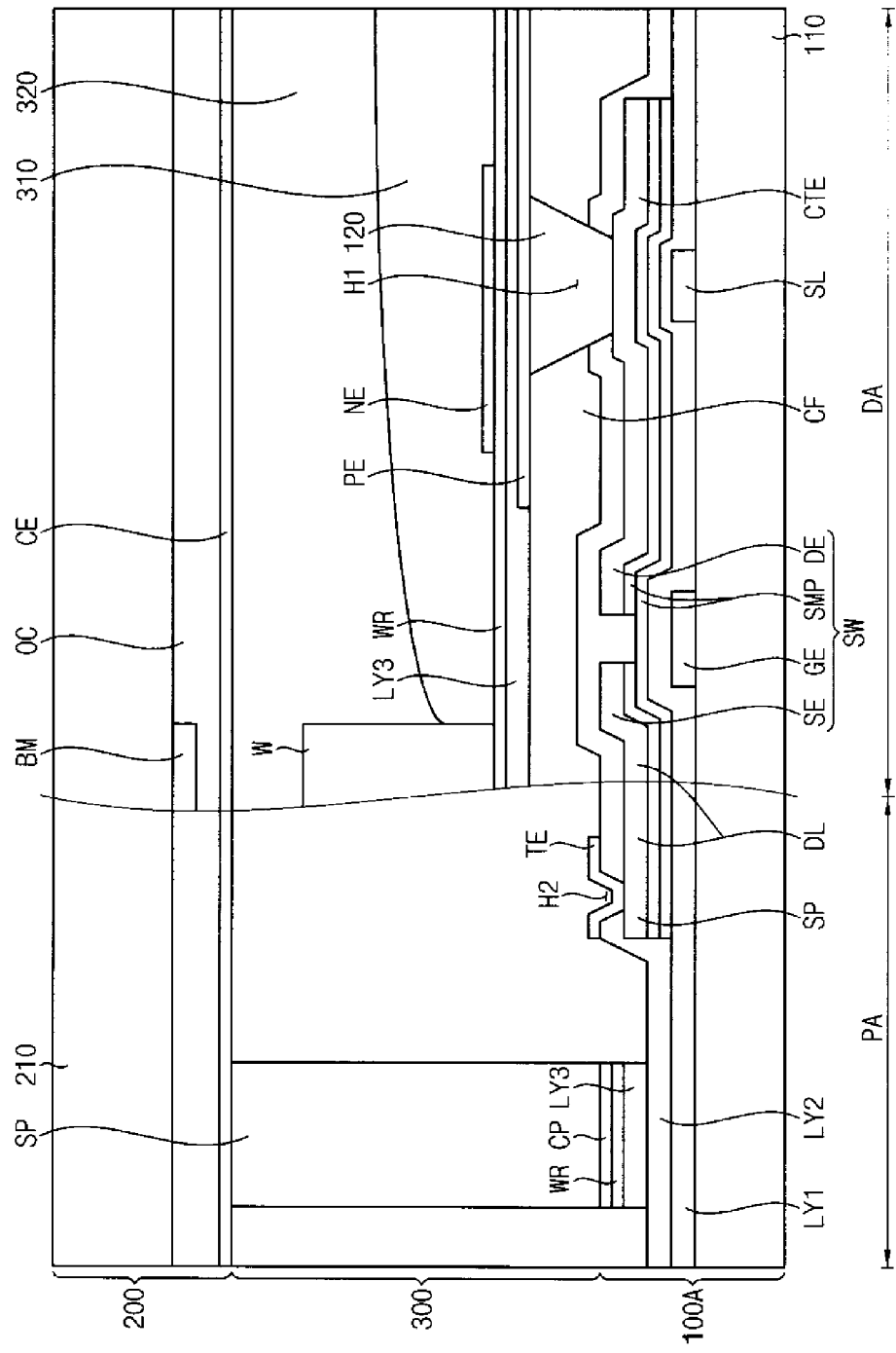
FIG. 4 is a cross-sectional view of an alternative exemplary embodiment of a first electro-wetting display substrate according to the invention.

FIG. 4 is a cross-sectional view illustrating an alternative exemplary embodiment of a first electro-wetting display substrate according to the invention.

The first electro-wetting display substrate shown in FIG. 4 is substantially the same as the first electro-wetting display substrate of FIGS. 1 and 2 except for a filling member. The same or like elements shown in FIG. 4 have been labeled with the same reference characters as used above to describe the exemplary embodiments of the first electro-wetting display substrate shown in FIGS. 1 and 2, and any repetitive detailed description thereof will hereinafter be omitted or simplified.

Referring to FIG. 4, a pixel part of the first electro-wetting display substrate 110A includes a gate line GL, a storage line SL, a first insulating layer LY1, a data line DL, a switching element SW, a contact electrode CTE, a second insulating layer LY2, a color filter pattern CF, a pixel electrode PE, a third insulating layer LY3, a water-repellent layer WR, a notch electrode NE, a partition wall W and a filling member 120.

In such an embodiment, the filling member 120 is disposed in a first contact hole H1 formed through the second insulating layer LY2 and the color filter pattern CF such that the color filter pattern CF is flattened by the filling member 120.

The pixel electrode PE is disposed on the color filter pattern CF and the filling member 120.

In such an embodiment, the filling member 120 electrically connects the pixel electrode PE to the contact electrode CTE.

Hereinafter, an exemplary embodiment of a method of manufacturing the first electro-wetting display substrate 100A of FIG. 4 will now be described.

In an exemplary embodiment, the filling member 120 is provided by filling the first contact hole H1 formed in the second insulating layer LY2 and the color filter pattern CF in the display area DA of the first base substrate 110 with conductive filling material. In one exemplary embodiment, for example, the first contact hole H1 may be filled with the conductive filling material using an ink jet process. The filling member 120 may include metal material having a small contact resistance. In one exemplary embodiment, for example, the filling member 120 may include silver (Ag).

The pixel electrode PE is provided on the first base substrate 110 including the filling member 120 disposed in the first contact hole H1.

In an exemplary embodiment, the second contact hole H2 formed in the second insulating layer LY2 and the color filter pattern CF in the peripheral area PA of the first base substrate 110 may be filled with the conductive filling material.

In such an embodiment, the first electro-wetting display substrate 100A including the filling member 120 in the first and second contact holes H1 and H2 is provided.

According to an exemplary embodiment, the first electro-wetting display substrate 100A includes the filling member 120 disposed in the first contact hole H1 formed in the second insulating layer LY2 and the color filter pattern CF, such that unevenness due to the first contact hole H1 may be effectively prevented or substantially reduced. In such an embodiment, when the first fluid 310 moves in the pixel part, In this application, the water-repellent layer covers the notch electrode such that the notch electrode is effectively prevent from being in contact with first and second fluids and the reliability of the electro-wetting display panel including the first electro-wetting display substrate is substantially improved. In this application, a notch electrode is disposed over a pixel electrode, and overlaps a drain electrode of a switching element and a storage line, such that the aperture ratio of the pixel part is substantially increased. In this application, the notch electrode is disposed over the pixel electrode such that a second storage capacitor is collectively defined by the notch electrode and the pixel electrode. Accordingly, a size of the storage line of a first storage capacitor can be decreased to increase the aperture ratio of the pixel part.

Figure 5:
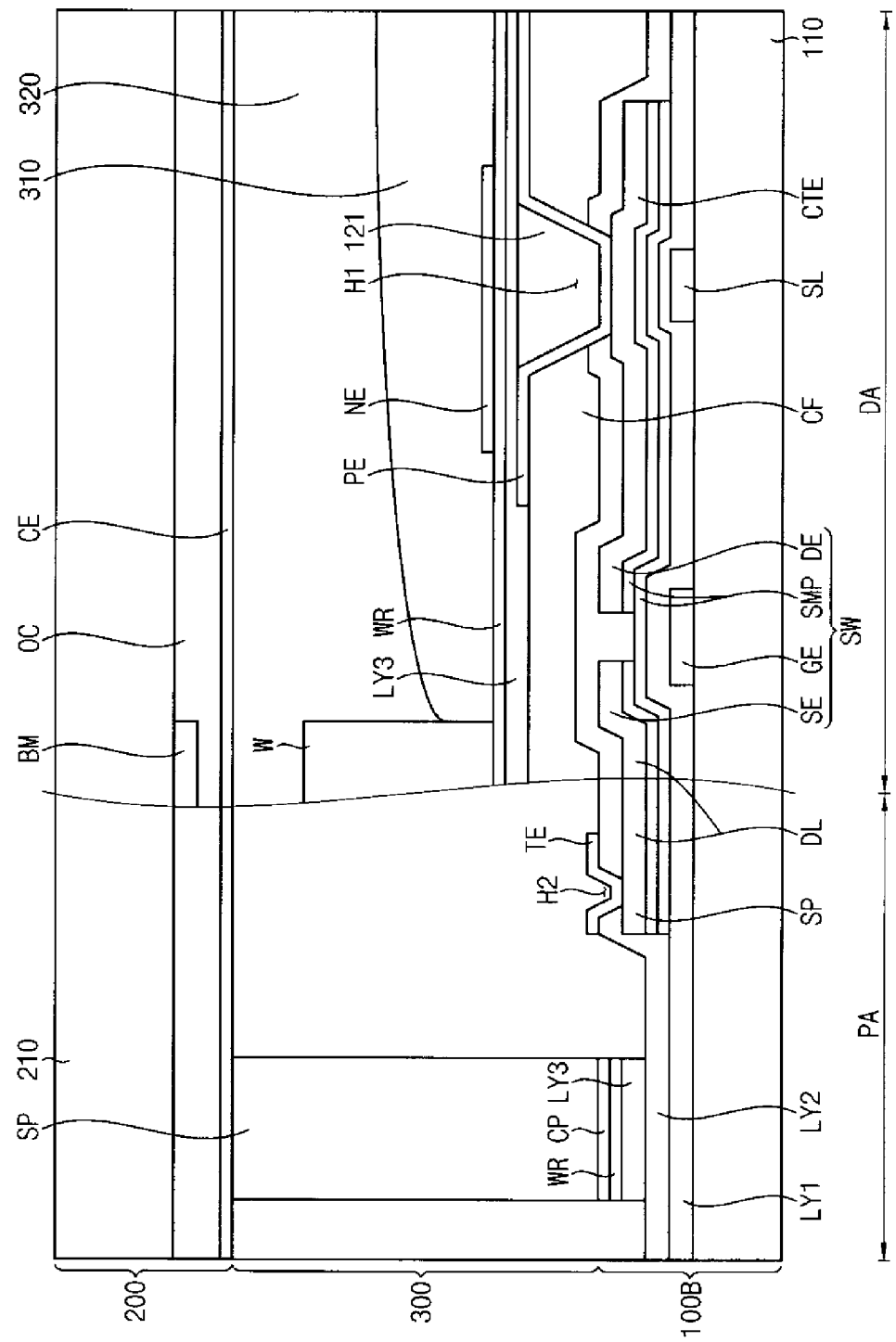
FIG. 5 is a cross-sectional view of another alternative exemplary embodiment of a first electro-wetting display substrate according to the invention.

FIG. 5 is a cross-sectional view illustrating another alternative exemplary embodiment of a first electro-wetting display substrate according to the invention.

The first electro-wetting display substrate shown in FIG. 4 is substantially the same as the first electro-wetting display substrate of FIGS. 1 and 2 except for a filling member. The same or like elements shown in FIG. 5 have been labeled with the same reference characters as used above to describe the exemplary embodiments of the first electro-wetting display substrate shown in FIGS. 1 and 2, and any repetitive detailed description thereof will hereinafter be omitted or simplified.

Referring to FIG. 5, a pixel part of a first electro-wetting display substrate 100B according to the present exemplary embodiment includes a gate line GL, a storage line SL, a first insulating layer LY1, a data line DL, a switching element SW, a contact electrode CTE, a second insulating layer LY2, a color filter pattern CF, a pixel electrode PE, a third insulating layer LY3, a water-repellent layer WR, a notch electrode NE, a partition wall W and a filling member 121.

In such an embodiment, a first contact hole H1, which is formed in the second insulating layer LY2 and the color filter pattern CF and in which the pixel electrode PE is disposed, is filled with the filling member 121. The pixel electrode PE is disposed between the filling member 121 and each of the drain electrode DE, the second insulating layer LY2 and the color filter pattern CF.

Hereinafter, an exemplary embodiment of a method of manufacturing the first electro-wetting display substrate 100B of FIG. 5 will be described.

The pixel electrode PE is provided on the color filter pattern CF in which the first contact hole H1 is formed in the display area DA of the first base substrate 110. The pixel electrode PE is provided in the first contact hole H1.

In such an embodiment, the filling member 121 is provided by filling the first contact hole H1, which is formed in the second insulating layer LY2 and the color filter pattern CF and in which the pixel electrode PE is provided, with conductive filling material. In one exemplary embodiment, for example, the first contact hole H1 may be filled with the conductive filling material using an ink jet process. In one exemplary embodiment, for example, the filling member may include silver (Ag). In an alternative exemplary embodiment, the filling member 121 may include an insulation filling material.

In such an embodiment, the transparent electrode TE is provided on the second insulating layer LY2, in which the second contact hole H2 is formed in the peripheral area PA of the first base substrate 110. The transparent electrode TE is provided on the second contact hole H2, which is formed in the second insulating layer LY2, and then the conductive filling material is provided on a second hole portion of the transparent electrode TE.

In such an embodiment, the first electro-wetting display substrate 100B includes the filling member 121 in the first contact hole H1, in which the pixel electrode PE is disposed.

According to an exemplary embodiment, the first electro-wetting display substrate 100B includes the filling member 121 disposed in the first contact hole H1, which formed through the second insulating layer LY2 and the color filter pattern CF and in which the pixel electrode PE is formed, such that unevenness due to the first contact hole H1 may be substantially reduced or effectively prevented. In such an embodiment, when the first fluid 310 moves in the pixel part a break-up of the first fluid 310 due to the first contact hole H1 is effectively prevented.

Figure 6:
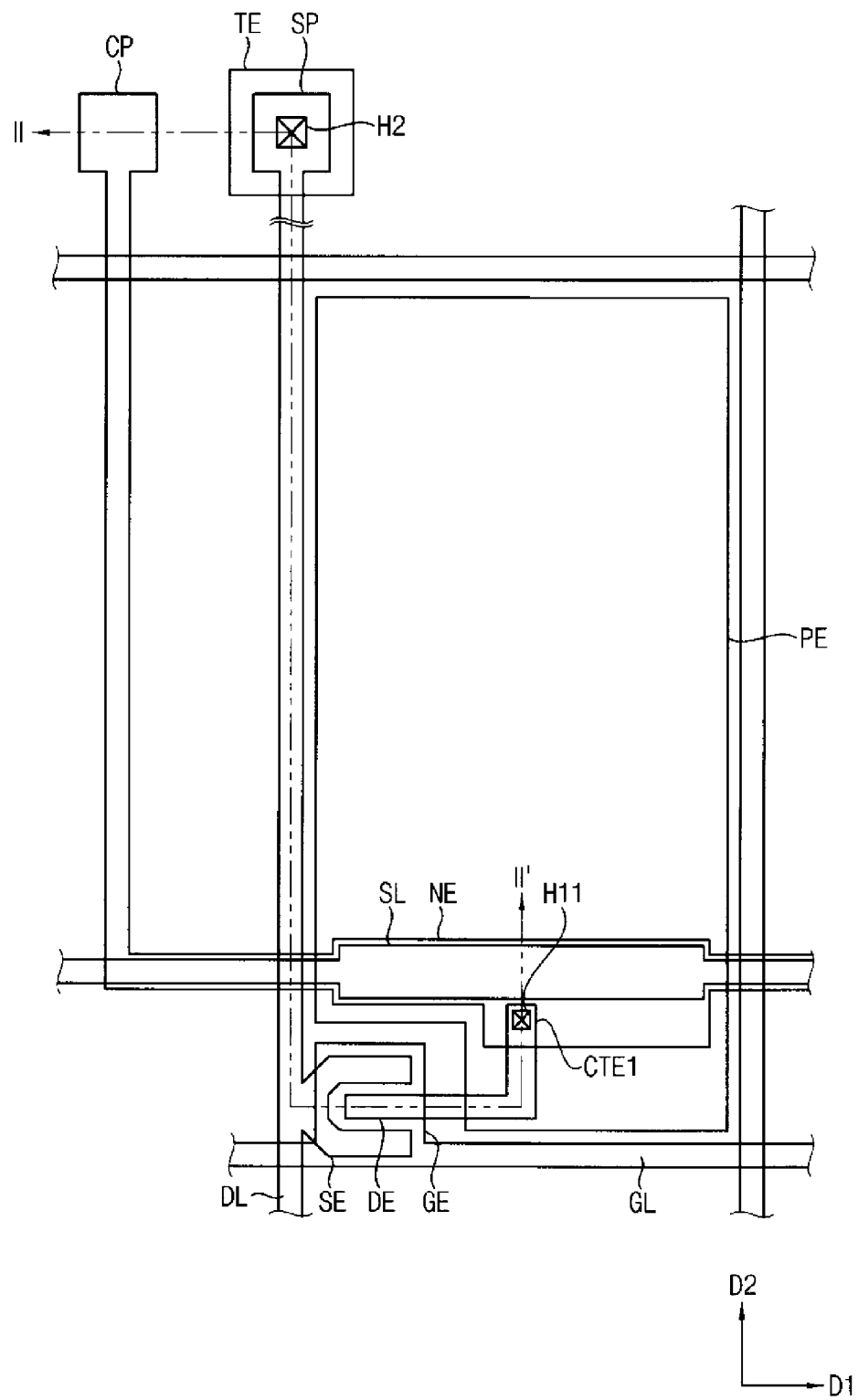
FIG. 6 is a plan view of still another alternative exemplary embodiment of a first electro-wetting display substrate according to the invention.
Figure 7:
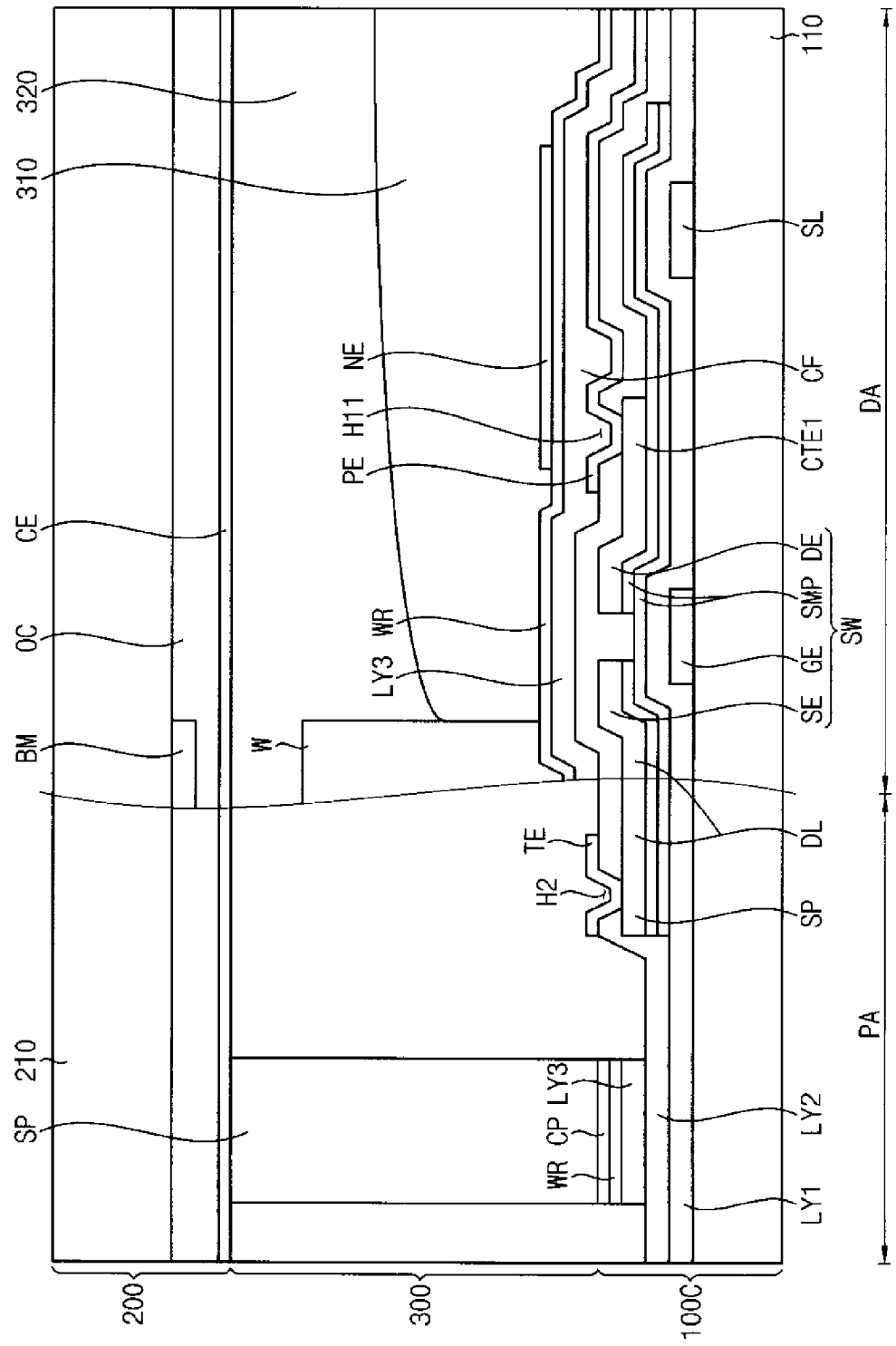
FIG. 7 is a cross-sectional view taken along line II-II' of FIG. 6, illustrating an electro-wetting display panel including the first electro-wetting display substrate of FIG. 6.

FIG. 6 is a plan view of another alternative exemplary embodiment of a first electro-wetting display substrate according to the invention. FIG. 7 is a cross-sectional view taken along line II-II' of FIG. 6, illustrating an electro-wetting display panel including the first electro-wetting display substrate of FIG. 6.

The first electro-wetting display substrate in FIGS. 6 and 7 is substantially the same as the first electro-wetting display substrate shown in FIGS. 1 and 2 except for the first storage capacitor. The same or like elements shown in FIGS. 6 and 7 have been labeled with the same reference characters as used above to describe the exemplary embodiments of the first electro-wetting display shown in FIGS. 1 and 2, and any repetitive detailed description thereof will hereinafter be omitted or simplified.

Referring to FIGS. 6 and 7, a pixel part of a first electro-wetting display substrate 100C includes a gate line GL, a storage line SL, a first insulating layer LY1, a data line DL, a switching element SW, a contact electrode CTE1, a second insulating layer LY2, a pixel electrode PE, a third insulting layer LY3, a water-repellent layer WR, a notch electrode NE and a partition wall W.

The switching element SW includes a gate electrode GE, a source electrode SE, a drain electrode DE and a semiconductor pattern SMP.

The gate electrode GE extends from the gate line GL. The source electrode SE extends from the data line DL, and overlaps the gate electrode GE. The drain electrode DE is spaced apart from the source electrode SE, and overlaps the gate electrode GE.

The contact electrode CTE1 is disposed on the first insulating layer LY1 and may extend from the drain electrode DE to the pixel electrode PE. In such an embodiment, the contact electrode CTE1 may be electrically connected to the pixel electrode PE via a first contact hole H11 formed in the second insulating layer LY2.

The storage line SL may be spaced apart from each of the gate electrode GE and the contact electrode CTE1.

The notch electrode NE is disposed on the water-repellent layer WR and overlaps an end portion of the pixel electrode PE, which is adjacent to the switching element SW.

In one exemplary embodiment, for example, the notch electrode NE is disposed along the storage line SL, and overlaps the storage line SL.

In such an embodiment, the storage line SL and the pixel electrode PE collectively define a first storage capacitor with the first and second insulating layer LY1 and LY2 as a dielectric.

In such an embodiment, the notch electrode NE and the pixel electrode PE collectively define a second storage capacitor with the third insulating layer LY3 as a dielectric.

In an exemplary embodiment, as shown in FIG. 7, the first electro-wetting display substrate 100C includes only the second insulating layer LY2 between the contact electrode CTE and the pixel electrode PE. In an alternative exemplary embodiment, the first electro-wetting display substrate may further include a color filter pattern between the contact electrode CTE and the pixel electrode PE, as shown in FIG. 1.

A method of manufacturing the first electro-wetting display substrate 100C in FIG. 7 is substantially the same as the method of manufacturing the first electro-wetting display substrate shown in FIG. 1 except for a shape of the contact electrode CTE, and thus any repetitive detailed description thereof will be omitted.

According to an exemplary embodiment, the first electro-wetting display substrate 100C includes the notch electrode NE disposed overlapping the pixel electrode PE and the storage line SL, such that the aperture ratio of the pixel part is substantially increased.

Figure 8:
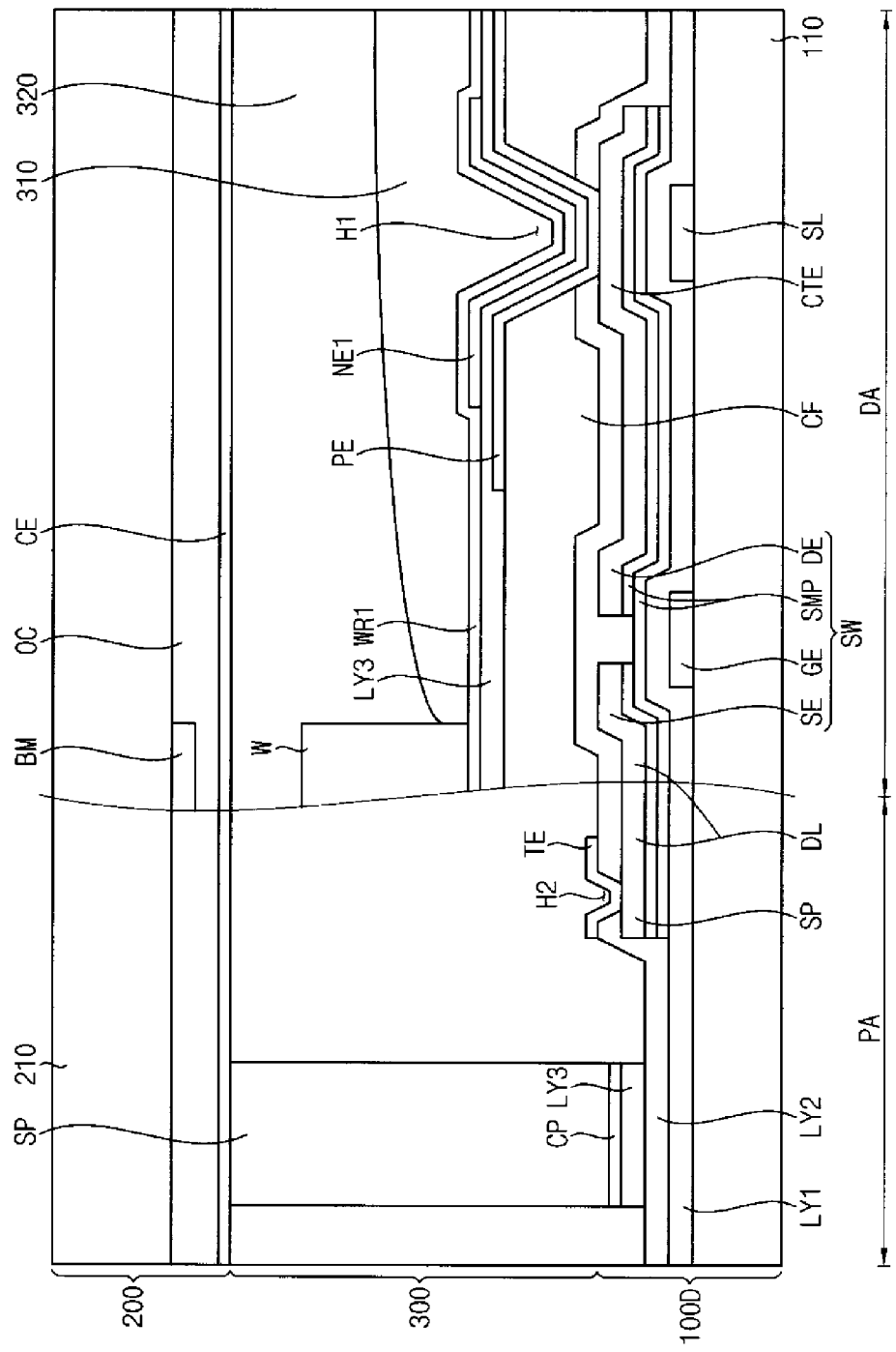
FIG. 8 is a cross-sectional view of yet another alternative exemplary embodiment of a first electro-wetting display substrate according to the invention.

FIG. 8 is a cross-sectional view of another alternative exemplary embodiment of a first electro-wetting display substrate according to the invention.

The first electro-wetting display substrate shown in FIG. 8 is substantially the same as the first electro-wetting display substrate of FIGS. 1 and 2 except for a water-repellent layer and a notch electrode. The same or like elements shown in FIG. 8 have been labeled with the same reference characters as used above to describe the exemplary embodiments of the first electro-wetting display substrate shown in FIGS. 1 and 2, and any repetitive detailed description thereof will hereinafter be omitted or simplified.

Referring to FIG. 8, a pixel part of a first electro-wetting display substrate 100D includes a gate line GL, a storage line SL, a first insulating layer LY1, a data line DL, a switching element SW, a contact electrode CTE, a second insulating layer LY2, a color filter pattern CF, a pixel electrode PE, a third insulating layer LY3, a water-repellent layer WR1, a notch electrode NE1 and a partition wall W.

The notch electrode NE1 is disposed on the third insulating layer LY3 and overlaps an end of the pixel electrode PE, which is adjacent to the switching element SW. In one exemplary embodiment, for example, the notch electrode NE1 overlaps the contact electrode CTE.

The water-repellent layer WR1 is disposed on the notch electrode NE1, and covers the notch electrode NE1 such that the water-repellent layer WR1 effectively prevents the notch electrode NE1 from being in direct contact with the first and second fluids 310 and 320.

Figure 9A:
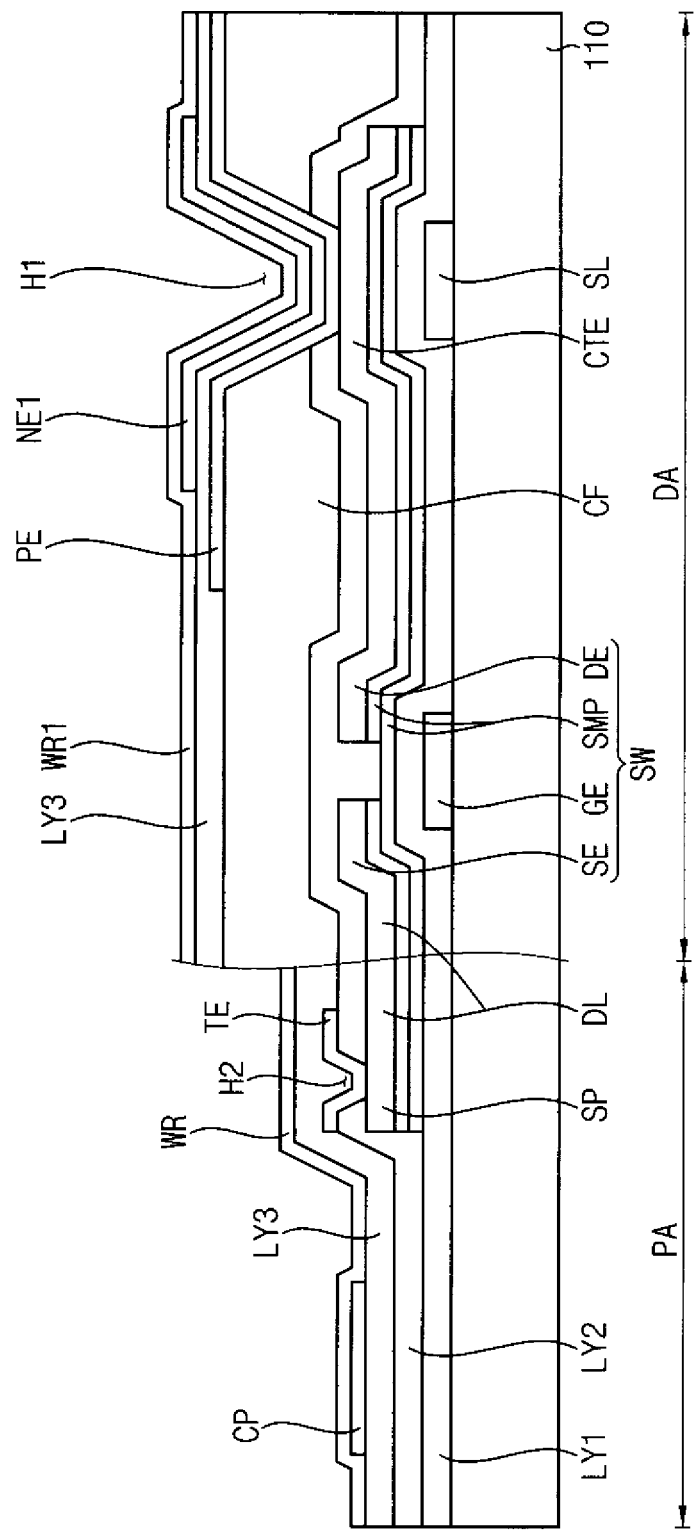
FIGS. 9A and 9B are cross-sectional views illustrating an exemplary embodiment of a method of manufacturing the first electro-wetting display substrate of FIG. 8.
Figure 9B:
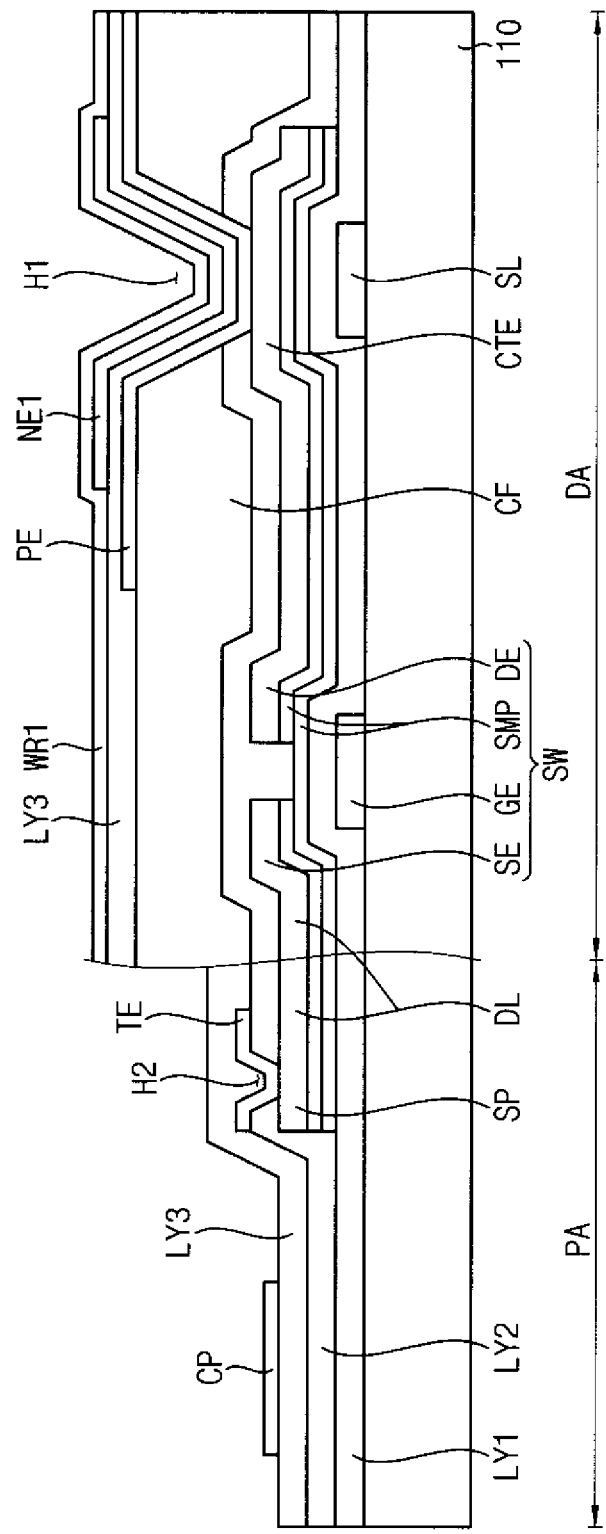

FIGS. 9A and 9B are cross-sectional views illustrating an exemplary embodiment of a method of manufacturing the first electro-wetting display substrate of FIG. 8.

Referring to FIG. 9A, the third insulating layer LY3 is provided on the first base substrate 110 including the pixel electrode PE and the transparent electrode TE.

The notch electrode NE1 and the common pad CP extending from the notch electrode NE1 are provided on the third insulating layer such that the notch electrode NE1 overlaps the contact electrode CTE. In one exemplary embodiment, for example, the notch electrode NE1 may be provided using a sputtering process, a roll-printing process or an ink jet process, for example. The third insulating layer LY3 has a glass transition temperature higher than a glass transition temperature of the water-repellent layer WR1 such that the third insulating layer LY3 is provided using a metal coating process.

In such an embodiment, the water-repellent layer WR1 is provided on the first base substrate 110 including the notch electrode NE1 and the common pad CP.

Referring to FIG. 9B, the water-repellent WR1 in the peripheral area PA of the first base substrate 110 is removed using a shadow mask, such that the common pad CP and the third insulating layer LY3 are exposed. In an exemplary embodiment, the common pad CP may be electrically connected to the common electrode CE of the second electro-wetting display substrate 200 via a short point, and may receive a common voltage.

Referring again to FIG. 8, the third insulating layer LY3 in the peripheral area PA of the first base substrate 110 is removed using a shadow mask, such that the transparent electrode TE is exposed. In such an embodiment, the transparent electrode TE may be electrically connected to, for example, a data driver, and may receive a data signal.

According to an exemplary embodiment, the water-repellent layer WR1 covers the notch electrode NE1, such that the notch electrode NE1 is effectively prevented from being exposed by the first and second fluids 310 and 320. In such an embodiment, the reliability of the electro-wetting display panel including the first electro-wetting display substrate 100D is substantially improved.

Figure 10:
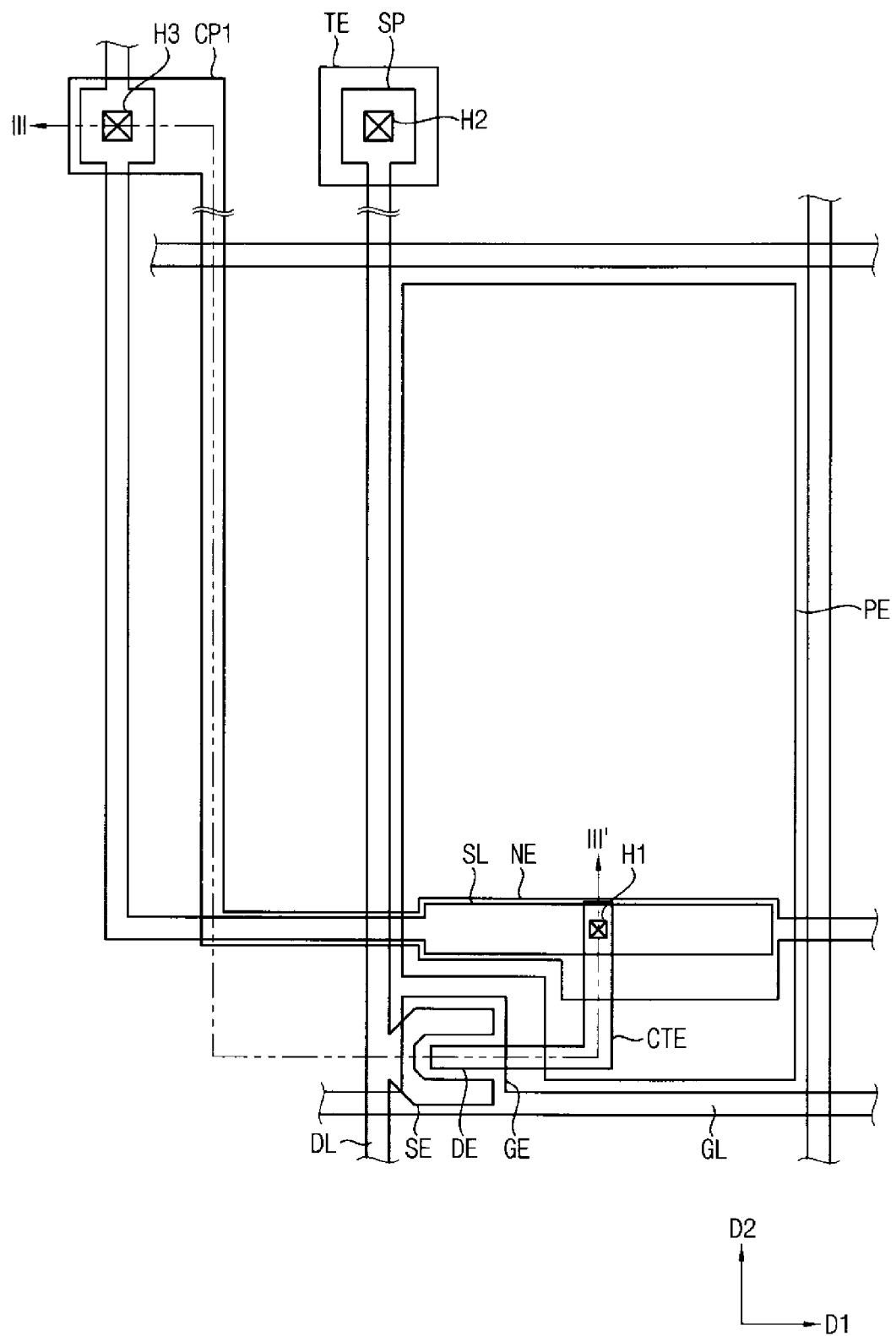
FIG. 10 is a plan view of still another alternative exemplary embodiment of a first electro-wetting display substrate according to the invention.
Figure 11:
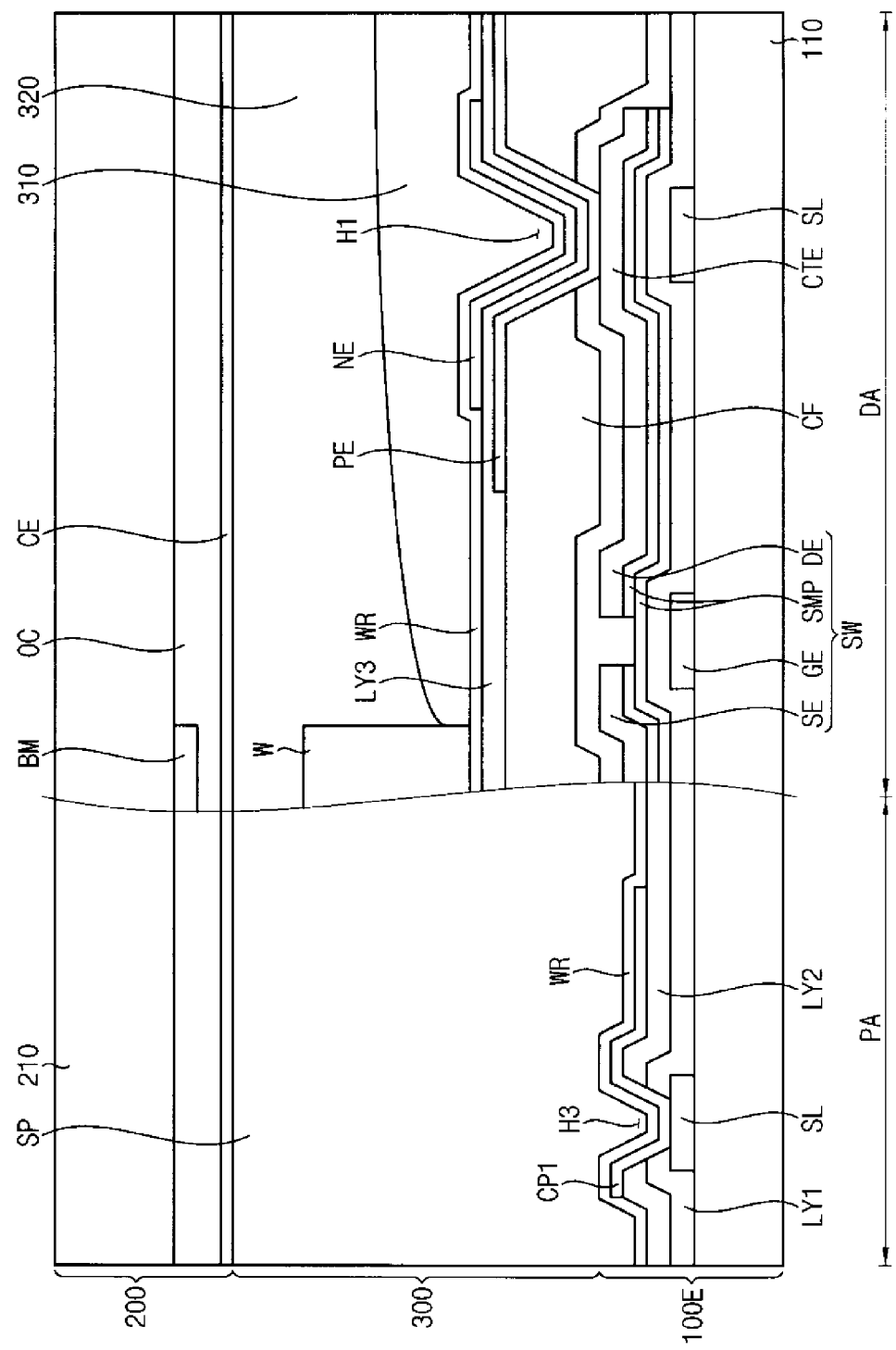
FIG. 11 is a cross-sectional view taken along line III-III' of FIG. 10, illustrating an electro-wetting display panel including a first electro-wetting display substrate of FIG. 10.

FIG. 10 is a plan view of another alternative exemplary embodiment of a first electro-wetting display substrate according to the invention. FIG. 11 is a cross-sectional view taken along line III-III' of FIG. 10, illustrating an electro-wetting display panel including a first electro-wetting display substrate of FIG. 10.

The first electro-wetting display substrate shown in FIGS. 10 and 11 is substantially the same as the first electro-wetting display substrate of FIGS. 1 and 2 except for the pad part. The same or like elements shown in FIGS. 10 and 11 have been labeled with the same reference characters as used above to describe the exemplary embodiments of the first electro-wetting display substrate shown in FIGS. 1 and 2, and any repetitive detailed description thereof will hereinafter be omitted or simplified.

Referring to FIGS. 10 and 11, a pad part of a first electro-wetting display substrate 100E includes a signal pad SP extending from a data line DL, a transparent electrode TE electrically connected to the signal pad SP via a second contact hole H2 and a common pad CP1 extending from a notch electrode NE.

In an exemplary embodiment, the common pad CP1 is electrically connected to the storage line SL, which is extending from a display area DA of the first base substrate 110 to a peripheral area PA of the first base substrate 110, via a third contact hole H3. In such an embodiment, the common pad CP1 may receive a common voltage from the storage line SL, and may provide the common voltage to the notch electrode NE.

The pad part may further include a storage pad (not shown) extending from the storage line SL. The storage pad may be electrically connected to, for example, a data driver, and may receive the common voltage.

Figure 12A:
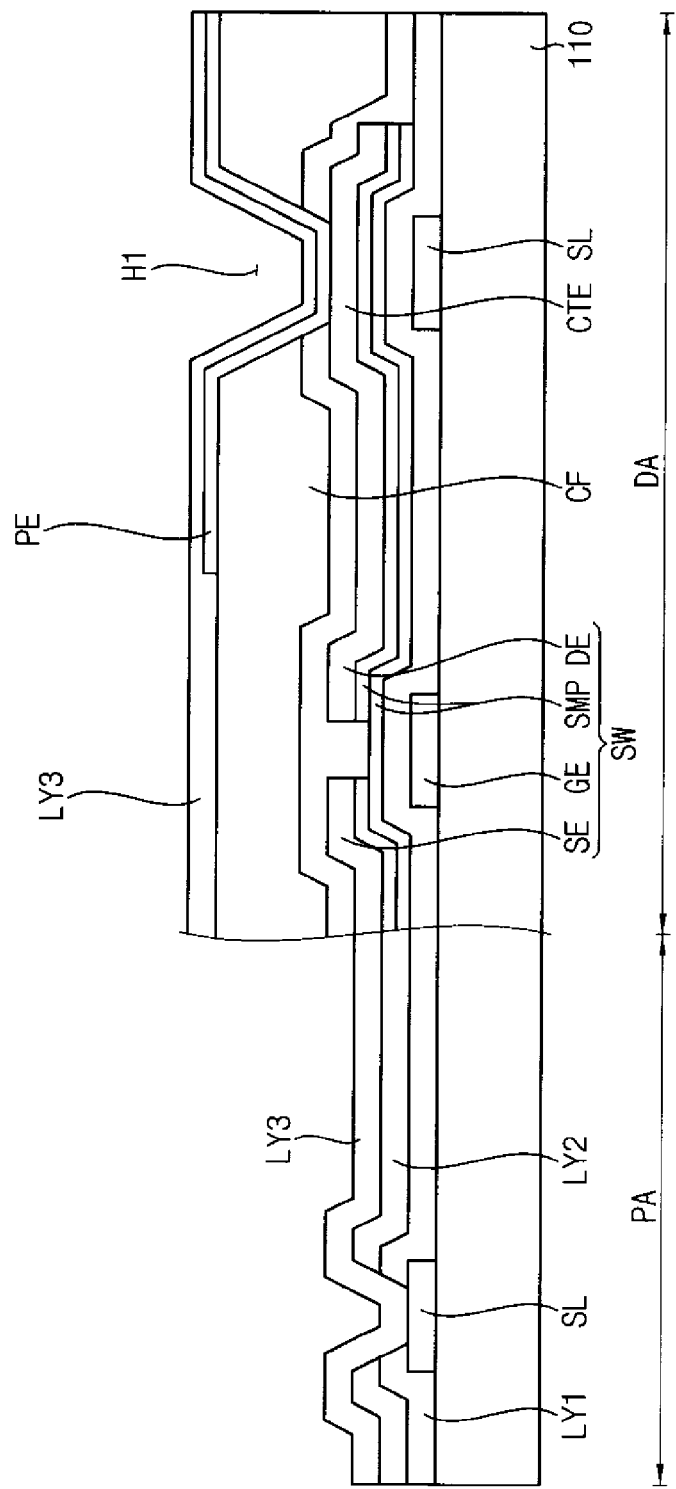
FIGS. 12A and 12B are cross-sectional views illustrating an exemplary embodiment of a method of manufacturing the first electro-wetting display substrate of FIG. 10.
Figure 12B:
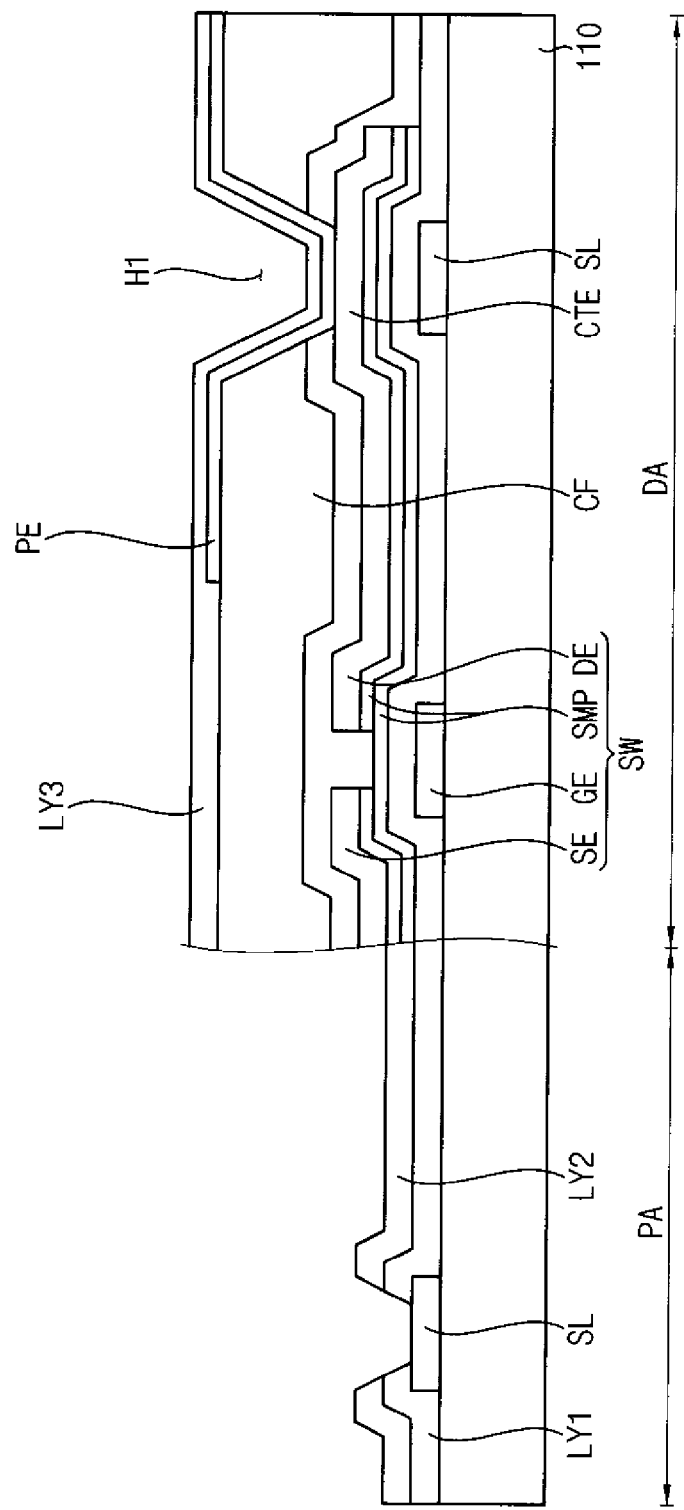

FIGS. 12A and 12B are cross-sectional views illustrating an exemplary embodiment of a method of manufacturing the first electro-wetting display substrate of FIG. 10.

Referring to FIG. 12A, the second insulating layer LY2 and the color filter pattern CF in the display area DA of the first base substrate 110 are partially removed, such that the first contact hole H1 is formed in the display area DA of the first base substrate 110. In such an embodiment, the first contact hole H1 partially exposes the contact electrode CTE.

The second contact hole H2 is formed in the peripheral area PA of the first base substrate 110 by partially removing the second insulating layer in the peripheral area PA. In such an embodiment, the second contact hole H2 partially exposes the signal pad SP.

The first and second insulating layers LY1 and LY2 are partially removed in the peripheral area PA of the first base substrate 110 to form the third contact hole H3. The third contact hole H3 partially exposes the storage line SL in the peripheral area of the first base substrate 110, which is extending from the display area DA of the first base substrate 110.

The pixel electrode PE is provided on the color filter pattern CF, in which the first contact hole H1 is formed, and the transparent electrode TE is provided on the second insulating layer LY2, in which the second contact hole H2 is formed.

The third insulating layer LY3 is provided on the first base substrate 110 including the pixel electrode PE and the transparent electrode TE.

Referring to FIG. 12B, the third insulating layer LY3 is partially removed using a shadow mask, such that the storage line SL is exposed through the third contact hole H3.

Referring again to FIG. 11, the notch electrode NE is provided on the third insulating layer LY3, and the common pad CP1 is provided on the second insulating layer LY2. The notch electrode NE overlaps the contact electrode CTE, and the common pad CP1 is electrically connected to the storage line SL.

The water-repellent layer WR is provided on the first base substrate 110 including the notch electrode NE and the common pad CP1.

According to an exemplary embodiment, the water-repellent layer WR covers the notch electrode NE, such that the notch electrode NE is effectively prevent from being in contact with the first and second fluids 310 and 320. In such an embodiment, the reliability of the electro-wetting display panel including the first electro-wetting display substrate 100E is substantially improved.

According to exemplary embodiments, a notch electrode is disposed over a pixel electrode, and overlaps a drain electrode of a switching element, such that an aperture ratio of a pixel part is substantially increased.

In an exemplary embodiment, the notch electrode is disposed over the pixel electrode, and overlaps a storage line, such that the aperture ratio of the pixel part is substantially increased.

In an exemplary embodiment, the notch electrode is disposed over the pixel electrode, such that a second storage capacitor is collectively defined by the notch electrode and the pixel electrode. In such an embodiment, a size of the storage line of a first storage capacitor decreases, such that the aperture ratio of the pixel part is substantially increased.

In an exemplary embodiment, a filling member is disposed in a first contact hole, such that unevenness due to the first contact hole is effectively prevented, and a break-up of a first fluid due to the first contact hole is thereby effectively prevented.

In an exemplary embodiment, a water-repellent layer is disposed on the notch electrode, such that the notch electrode is effectively prevented from being in direct contact with a second fluid, and the reliability of the notch electrode is thereby substantially improved.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific exemplary embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. An electro-wetting display substrate comprising:
  a base substrate including a gate line extending in a first direction and a data line extending in a second direction, wherein the first direction is different from the second direction;

a switching element electrically connected to the gate line and the data line;

a pixel electrode electrically connected to the switching element;

a notch electrode disposed adjacent to the switching element and overlapping the pixel electrode; and a water-repellent layer disposed over the pixel electrode.

2. The electro-wetting display substrate of claim 1, wherein the notch electrode overlaps a contact electrode extending from a drain electrode of the switching element.

3. The electro-wetting display substrate of claim 2, further comprising:

a storage line spaced apart from a gate electrode of the switching element and overlapping the pixel electrode, wherein the contact electrode extends along the storage line.

4. The electro-wetting display substrate of claim 3, further comprising:

a first insulating layer disposed between the storage line and the contact electrode;

a second insulating layer disposed between the contact electrode and the pixel electrode; and a third insulating layer disposed between the pixel electrode and the notch electrode, wherein the storage line, the contact electrode and the first insulating layer define a first capacitor, and wherein the pixel electrode, the notch electrode and the third insulating layer define a second capacitor.

5. The electro-wetting display substrate of claim 4, wherein the second insulating layer includes a color filter pattern.

6. The electro-wetting display substrate of claim 4, wherein the water-repellent layer is disposed between the third insulating layer and the notch electrode.

7. The electro-wetting display substrate of claim 6, further comprising:

a common pad extending from the notch electrode, wherein a common voltage is applied to the common pad;

a data pad extending from the data line; and a transparent electrode electrically connected to the data pad, wherein a data signal is applied to the transparent electrode, wherein a hole is formed through a portion of the third insulating layer and the water-repellent layer such that the transparent electrode is connected to an external device through the hole.

8. The electro-wetting display substrate of claim 4, wherein the water-repellent layer is disposed on the notch electrode.

9. The electro-wetting display substrate of claim 8, further comprising:

a common pad extending from the notch electrode, wherein a common voltage is applied to the common pad, and wherein a hole is formed through a portion of the water-repellent layer such that the common pad is connected to a short point through the hole.

10. The electro-wetting display substrate of claim 4, further comprising:

a filling member disposed in a contact hole, which is formed through the second and third insulating layers and partially exposes the contact electrode, wherein the filling member includes a conductive material.

11. The electro-wetting display substrate of claim 10, wherein the pixel electrode is disposed between the contact hole and the filling member.

12. The electro-wetting display substrate of claim 1, further comprising:

a storage line spaced apart from a gate electrode of the switching element, and overlapping the pixel electrode.

wherein the storage line is spaced apart from a contact electrode extending from a drain electrode of the switching element, and wherein the notch electrode overlaps the storage line.

13. A method of manufacturing an electro-wetting display substrate, the method comprising:

forming a gate pattern on a base substrate, wherein the gate pattern includes a gate line and a gate electrode extending from the gate line;

forming a data pattern on the base substrate, on which the gate pattern is disposed, wherein the data pattern includes a data line extending in a direction different from the gate line, a source electrode extending from the data line, and a drain electrode spaced apart from the source electrode;

forming a pixel electrode on the base substrate, on which the data pattern is formed, wherein the pixel electrode is electrically connected to the drain electrode;

forming a notch electrode on the base substrate, on which the pixel electrode is disposed, wherein the notch electrode is adjacent to the switching element, and the notch electrode overlaps the pixel electrode; and forming a water-repellent layer over the pixel electrode.

14. The method of claim 13, wherein the forming the data pattern on the base substrate, on which the gate pattern is disposed, comprises:

forming a contact electrode extending from the drain electrode, wherein the notch electrode overlaps the contact electrode.

15. The method of claim 14, wherein the forming the gate pattern on a base substrate comprises:

forming a storage line spaced apart from the gate electrode, wherein the storage line overlaps the pixel electrode, wherein the contact electrode extends along the storage line.

16. The method of claim 13, further comprising:

forming a color filter pattern on the base substrate, on which the data pattern is formed; and removing a portion of the color filter pattern such that a contact hole is formed therein, wherein the contact hole exposes a contact electrode extending from a drain electrode of the switching element, and wherein the pixel electrode is connected to the contact electrode through the contact hole.

17. The method of claim 16, further comprising:

forming a filling member by filling a conductive filling material in the contact hole.

18. The method of claim 16, further comprising:

forming a filling member by filling a conductive filling material in the contact hole, in which the pixel electrode is disposed.

19. The method of claim 13, further comprising:

forming an insulating layer on the base substrate, on which the pixel electrode is formed, wherein the water-repellent layer is formed on the insulating layer, and wherein the notch electrode is formed on the water-repellent layer.

20. The method of claim 19, further comprising:
removing a portion of the insulating layer and the water-repellent layer using a shadow mask,
wherein the forming the pixel electrode on the base substrate, on which the data pattern is formed, comprises forming a transparent electrode connected to a data pad extending from the data line,
wherein a data signal is applied to the transparent electrode, and
wherein the transparent electrode is exposed through the removed portion of the insulating layer and the water-repellent layer.

21. The method of claim 13, further comprising:
forming an insulating layer on the base substrate, on which the pixel electrode is formed,
wherein the water-repellent layer is formed on the notch electrode.

22. The method of claim 21, further comprising:
removing a portion of the water-repellent layer using a shadow mask,
wherein the forming the notch electrode on the base substrate, on which the pixel electrode is disposed, comprises forming a common pad extending from the notch electrode,
wherein a common voltage provided from outside is applied to the common pad, and
wherein the common pad is exposed by the removed portion of water-repellent layer.

23. The method of claim 22, further comprising:
removing a portion of the insulating layer using a shadow mask,
wherein the forming the pixel electrode on the base substrate, on which the data pattern is formed, comprises forming a transparent electrode connected to a data pad extending from the data line,
wherein a data signal from outside is applied to the transparent electrode, and
wherein the transparent electrode is exposed through the removed portion of the insulating layer.

24. The method of claim 13, wherein
the forming the gate pattern on a base substrate comprises forming a storage line spaced apart from the gate electrode and overlapping the pixel electrode,
the forming the data pattern on the base substrate, on which the gate pattern is disposed, comprises forming a contact electrode extending from the drain electrode and spaced apart from the storage line, and
the notch electrode overlaps the storage line.

* * * * *